United States Patent [19]

Hawkins et al.

[11] Patent Number: 5,006,202
[45] Date of Patent: Apr. 9, 1991

[54] FABRICATING METHOD FOR SILICON DEVICES USING A TWO STEP SILICON ETCHING PROCESS

[75] Inventors: William G. Hawkins, Webster; Donald J. Drake, Rochester; James F. O'Neill, Penfield, all of N.Y.

[73] Assignee: Xerox Corporation, Stamford, Conn.

[21] Appl. No.: 533,204

[22] Filed: Jun. 4, 1990

[51] Int. Cl.$^5$ .................... H01L 21/306; B44C 1/22; C03C 15/00; C03C 25/06
[52] U.S. Cl. ................................ 156/644; 156/647; 156/651; 156/657; 156/661.1; 156/662; 346/140 R
[58] Field of Search ............ 156/644, 647, 651, 653, 156/657, 661.1, 662; 346/1.1, 76 PH, 140 R

[56] References Cited

U.S. PATENT DOCUMENTS

| Re. 32,572 | 1/1988 | Hawkins et al. | 156/626 |
|---|---|---|---|
| 3,654,000 | 4/1972 | Totah et al. | 156/17 |
| 4,585,513 | 4/1986 | Gale et al. | 156/630 |
| 4,683,646 | 8/1987 | Kando et al. | 29/611 |
| 4,829,324 | 5/1989 | Drake et al. | 346/140 R |
| 4,863,560 | 9/1989 | Hawkins | 156/644 |
| 4,899,181 | 2/1990 | Hawkins et al. | 346/140 R |

Primary Examiner—William A. Powell
Attorney, Agent, or Firm—Robert A. Chittum

[57] ABSTRACT

Disclosed is a method of fabricating a precision etched, three dimensional device from a silicon wafer, wherein the etching is done from one side of the wafer using a two step silicon etching process. A two-sided deposition of a robust protective layer, such as polycrystalline silicon, is placed over a two-sided deposition of a chemical masking layer such as silicon dioxide. The two layers are concurrently patterned with first and second sets of vias on one side of the wafer, while the opposite side is protected by the protective layer. The protective layer is removed to permit deposition of a second masking layer such as silicon nitride, followed by deposition of a second protective layer. Again, the second protective layer prevents damage to the fragile second masking layer on the wafer backside while its frontside is patterned with a similar set of vias aligned with the first set of vias in the first masking layer. This similar set of vias is sequentially formed in both the second protective layer and the underlying second masking layers. Then the wafer is placed in an etchant bath so that the first set of recesses is anisotropically etched in the wafer frontside side. Next, the second protective layer and second masking layer are removed to permit anisotropic etching of the second set of recesses through the second set of vias in the first masking layer. If the protective layer is polycrystalline silicon, it is concurrently etch-removed during the initial etching of the silicon wafer.

14 Claims, 9 Drawing Sheets

FABRICATING METHOD FOR SILICON DEVICES USING A TWO STEP SILICON ETCHING PROCESS

BACKGROUND OF THE INVENTION

1. Field of the Invention

This invention relates to fabrication of precision etched, three dimensional mechanical or electromechanical structures from silicon wafers, and more particularly to a method using a two step silicon etching process for the etching of the frontside of a chemically masked silicon wafer, while concurrently preventing crack producing damage to the etch resistant masks on the backside of the wafer, so that unintentional backside etching does not occur through such backside cracks. Backside etching will reduce the yield of frontside etched silicon structures as in, for example, ink flow-directing channel plates of ink jet printheads. A concurrently filed application by the same inventors and assignee entitled "Fabricating Method for Silicon Structures" discloses a similar invention, but using only a one step silicon etching process.

2. Description of the Prior Art

In wafer etching applications where precision etching of the frontside of a silicon wafer is required to produce mechanical or electromechanical structures or devices, the yield of such devices is reduced by damage to the backside masking layer of the wafer, thus allowing unintentional backside etching. Backside etch defects can destroy yield of die, such as, for example, thermal ink jet channel plates. Additionally, backside etch defects can interfere with the vacuum handling equipment required to process wafers after etching.

Backside masking thin films can be quite delicate and subject to mechanical damage during the normal wafer handling required for processing. An example of a common etch masking layer is silicon nitride, which is chemical vapor deposited as a tensilely stressed film. While silicon nitride has generally excellent chemical etch resistance to a wide variety of useful etches, its tensile stress facilitates scratching and cracking, since a crack relieves internal tensile stress. This means that any mechanical contact of the backside coat of silicon nitride tends to form open cracks and scratches which result in backside etch defects.

U.S. Pat. No. 4,683,646 to Kando et al discloses a thermal printhead and method of manufacture therefor which provides reduced risk of damage during the separation of individual printheads from the plurality of printheads formed on a single substrate. Since the heating elements require both an oxidation resisting layer and a wear resistant film thereover, the electrode interface board and heating element containing section are manufactured separately and then electrically mated to eliminate the need to cover the electrode interface with the oxidation resisting layer and the wear resistant layer. The heating element portion of the thermal printer is patterned along the length of lands formed by anisotropic etching of parallel, flat bottomed grooves in a silicon wafer. Linear arrays of parallel heating elements are formed along each land with associated parallel metal electrodes connecting adjacent heating elements across the flat-bottomed grooves, so that the heating elements are center-raised. The electrodes connected to the heating elements from parallel stripes in the grooves between heating elements. A removable reinforcing film is deposited over the heating elements and electrodes. The opposite side of the silicon wafer is lapped or etched off to expose the underside of the electrodes in the grooves. The wafer is diced to produce individual linear arrays of heating elements and the reinforcing film is removed, prior to mating of the heating element array with an electrode interface board which provides contact pads for outside electrical input.

U.S. Pat. No. 4,585,513 to Gale et al discloses a method of removing the exposed portion of a glass support plate mounted within a stepped recess of a housing, the recess having an opening in the bottom thereof to expose the glass plate. A thin flat single crystalline silicon member is adhered to the side of the glass plate opposite the side confronting the recess opening. A backing plate is adhered to the surface of the silicon member having circuitry thereon and opposite to the surface bonded to the glass plate. A protective material is deposited over the backing plate and any portion of the silicon member not covered by the backing plate. The glass plate exposed through the recess opening in the housing is etched to remove all of the exposed glass plate, and exposing the silicon member.

U.S. Pat. No. 3,654,000 to Totah et al discloses a wafer of silicon material containing semiconductive devices on one side and an oxide coating on the other side. A first rigid support plate is temporarily adhered to the semiconductive devices and the surface of the wafer containing them. The opposite side of the wafer having the oxide coating is masked and aligned in conformity with the devices on the other side. The oxide coating is selectively etched and the mask is removed, leaving the oxide to serve as mask for etching through the silicon wafer. A second rigid support plate is temporarily adhered to the oxide and exposed silicon walls to maintain the individual die with semiconductive devices in the original matrix locations when the first support plate and adhering material is removed to expose the devices for testing prior to removal of the second support plate. The invention is to etch the silicon material containing the semiconductive devices instead of scribing lines and breaking the wafer into discrete devices.

U.S. Pat. No. 4,863,560 to Hawkins discloses fabrication of three dimensional silicon structures from (100) silicon wafers by a single side, multiple step ODE etching process. All etching masks are formed one on top of the other prior to the initiation of etching, with the coarsest mask formed last and used first. Once the coarse anisotropic etching is completed, the coarse mask is removed and the finer anisotropic etching is done. The preferred embodiment is described using a thermal ink jet channel plate as the three dimensional structure, where coarse etching step provides the reservoir and the fine etching step provides the ink channels.

SUMMARY OF THE INVENTION

It is an object of the present invention to provide a mechanically protective film on the backside of silicon wafers over the backside chemical masking layer, so that an undamaged masking layer protects the wafer backside surface from etch damage. The mechanically protective film protects the integrity of the masking film by preventing mechanical damage thereto which leads to cracks that expose the wafer and enable unintentional etching.

It is another object of the present invention to provide a two-sided deposition of a robust mechanical damage protecting layer on top of a two-sided deposition of a chemical masking layer on a silicon wafer, in which the same type chemistry for pattern etching the mechanical damage protecting layer on the frontside of the wafer may be used to pattern the underlying chemical masking layer.

It is still another object of the present invention to provide a mechanical damage protecting layer that etches in the etchant used to etch the silicon wafer, so that the mechanical damage protecting layer is quickly removed in the etch bath, leaving the defect free chemical masking layer exposed on a completely etched wafer.

In the present invention, a two step etching process for fabricating a precision etched, three dimensional device from a silicon wafer by etching from only one side thereof is disclosed. One example of such a three dimensional device is, an ink flow directing channel plate which, when aligned and mated with a heater plate containing an array of a selectively addressable heating elements, forms a thermal ink jet printhead. The wafer has a frontside and a backside, and in one embodiment, the frontside alone is etched to form recesses therein. A first chemical masking layer, such as silicon dioxide ($SiO_2$), is deposited on the frontside and backside of the wafer, followed by the deposition thereover of a first mechanical damage protective layer, such as polycrystalline silicon. A first photoresist layer is applied to the frontside of the first protective layer on the wafer by, for example, mounting the backside of the wafer in a spin chuck and spin coating a first layer of photoresist on the wafer frontside surface. During the application and patterning of the first photoresist layer on the frontside of the wafer, the backside of the first masking layer is protected from crack producing mechanical damage by the first protective layer.

The first photoresist layer is patterned to produce a predetermined pattern of first and second sets of vias therein to expose the frontside surface of the wafer. The patterned first photoresist layer and first protective layer are stripped. A second masking layer, such as silicon nitride, is deposited over the patterned frontside and backside layers of the first masking layer, followed by the deposition of a second protective layer over the second masking layer, both frontside and backside. A second photoresist layer is applied and patterned on the frontside of the wafer over the frontside surface of the second protective layer, while the backside layer of the second masking layer is being protected by the second protective layer thereover. The second photoresist layer is patterned to produce a set of vias aligned with but, slightly smaller than, the first set of vias in the first masking layer on the wafer frontside. The second protective layer and underlying second masking layer are etched to produce a set of vias therein, exposing the frontside surface of the wafer through the first set of vias in the first masking layer. After removal of the second photoresist layer, the wafer is anisotropically etched to form a first set of coarse, relatively low toleranced recesses therein. The second protective layer and then the second masking layer are removed. The wafer is again placed in an etchant bath for anisotropically etching the smaller, high tolerance second set of recesses in the wafer frontside surface, and the first masking layer is removed, leaving a finished precision-etched, three dimensional device or a plurality of them awaiting separation by a sectioning process such as dicing. In another embodiment, the backside and the frontside of the wafer are etched, while the surface subject to mechanical damage during the patterning of the etch resistant masking layer is always similarly protected by a protective layer.

A more complete understanding of the present invention can be obtained by considering the following detailed description in conjunction with the accompanying drawings wherein like index numerals indicate like parts.

DETAILED DESCRIPTION OF THE PREFERRED EMBODIMENT

Figure 15:
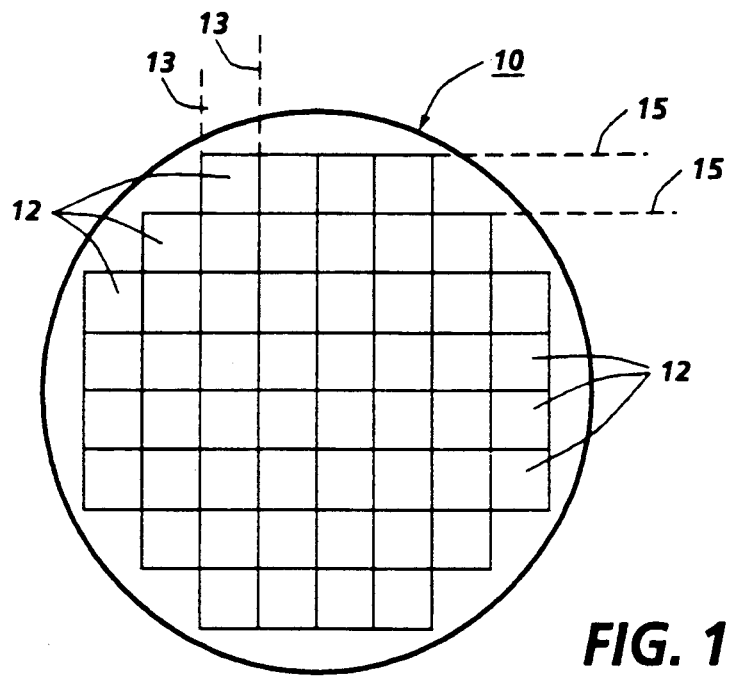
FIG. 15 is a schematic plan view of a silicon wafer having a plurality of devices etched therein.
Figure 16:
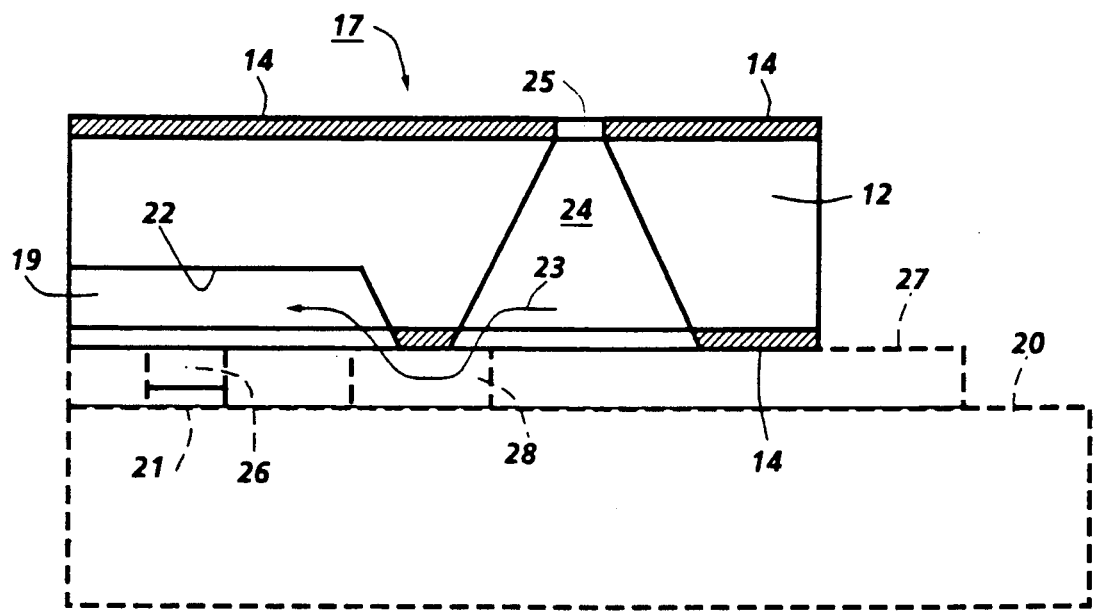
FIG. 16 is an enlarged, cross-sectional view of an etched channel plate as an example of an etch-fabricated three dimensional device, after separating the devices shown in FIG. 15 by a dicing operation.

A method of fabricating one or a plurality of precision etched, three dimensional structures 12 from a (100) silicon wafer 10 is shown in FIGS. 1 to 10. Referring to FIG. 15, a plurality of precision etched structures 12 are schematically depicted in the plan view of a silicon wafer 10 after the completion of the fabricating steps delineated in FIGS. 1–10, discussed below, and prior to dicing of the wafer along mutually perpendicular vertical and horizontal dashed dicing lines 13, 15, respectively. In FIG. 16, a typical example of a precision etched silicon structure 12 is shown as an ink flow directing channel plate that may be aligned and bonded to a heating element plate 20, shown in dashed line, to produce a thermal ink jet printhead 17 of the type disclosed in U.S. Pat. Nos. 4,899,181 and Re. 32,572, both of which are incorporated herein by reference. Ink (not shown) from an external supply (not shown) enters inlet 25 under a slightly negative pressure and fills reservoir 24, a recess anisotropically etched through silicon substrate 12. An array of parallel, elongated, relatively small, closely toleranced recesses 22 which serve as ink channels are anisotropically or isotropically etched after the larger, more loosely toleranced reservoir 24 is anisotropically etched. In one embodiment, the etching of the coarsely etched reservoir is completed concurrently with the etching of the channels. The channels are closed at the ends adjacent the reservoir and the other ends are open to serve as droplet emitting nozzles 19. As disclosed in the above referenced U.S. Pat. No. 4,899,181, ink flows from the reservoir 24 to the channels 22, as shown by arrow 23, through a recess 28 in a thick film insulative polymer layer 27, shown in dashed line, applied and patterned on the heating element plate 20. The thick film layer is also patterned to remove the thick film layer from above the heating elements 21 to form pits 26 which restrain lateral movement of temporary vapor bubbles (not shown) generated by the selective application of electrical pulses to the heating elements as well known in the art. The etch resistant mask 14, silicon nitride or silicon dioxide in the preferred embodiment, is removed from the channel plate, but may optionally remain prior to assembly with the heating element plate as shown. As disclosed in U.S. Pat. No. Re. 32,572, communication between the channels 22 and the reservoir 24 may be obtained by an etching step or by a milling operation, instead of recess 28 in the thick film layer 27.

Referring to FIGS. 1 to 10, the fabricating process or method will be described for the silicon structures 12, such as, for example, a channel plate as discussed above with reference to FIG. 16. Though a plurality of silicon structures 12 may be concurrently formed from a single silicon wafer 10, only a portion of one such structure 12 will be shown in cross section. Further, for ease in describing the process, only one closely toleranced recess parallel to a larger, more coarse or loosely toleranced recess will be discussed.

Figure 1:
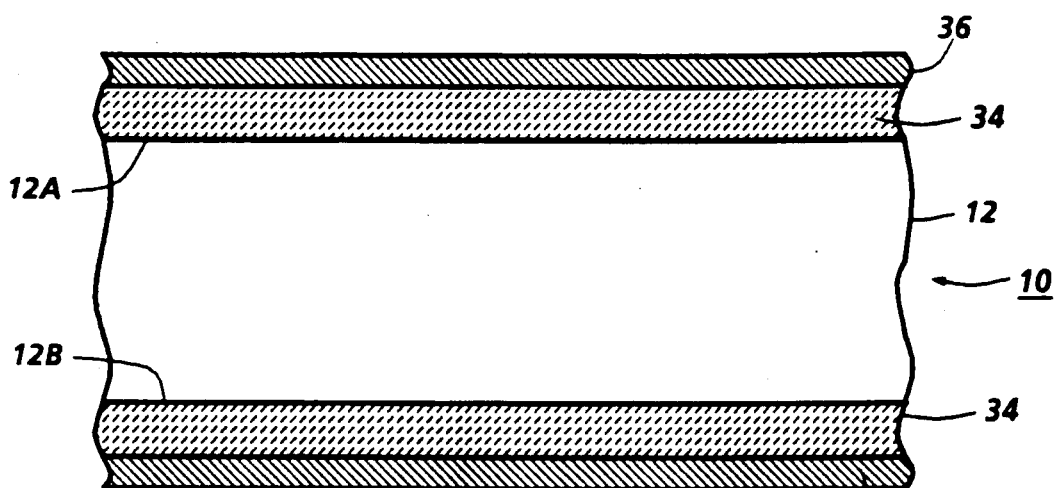
FIGS. 1–10 are cross-sectional views in various steps in fabricating a three dimensional device of the present invention.

In FIG. 1, a previously cleaned (100) silicon wafer 10 is partially shown in cross-section with a first etch resistant masking layer 34 which is preferably a thermally grown silicon dioxide ($SiO_2$) layer 34 on both sides which is about 5000Å thick each. The top side of the wafer portion or silicon structure 12, as viewed in FIG. 1, will be referred to as the frontside surface 12A and the bottom side will be referred to as the backside surface 12B. A first mechanical damage protective layer 36, such as polycrystalline silicon, is deposited by chemical vapor deposition (CVD) to a thickness of 0.1 to 1.0 μm over the frontside and backside surfaces of the silicon dioxide or oxide layer 34. The protective layer prevents mechanical damage to the masking layer on the backside of the wafer or silicon structure during the application and patterning of a photoresist or photoimagable layer on the frontside of the wafer or structure 12. Any damage to the backside masking layer causes cracks which lead to unintentional etching and reduction in yield. A typical first photoresist layer 30, such as, for example, KTI 820 ®, having a thickness of about 0.5 to 10 μm is spin coated on the protective layer 36 on frontside surface 12A of the silicon substrate 12 by use of a vacuum chuck (not shown), as is well known in the semiconductor industry.

Figure 2:
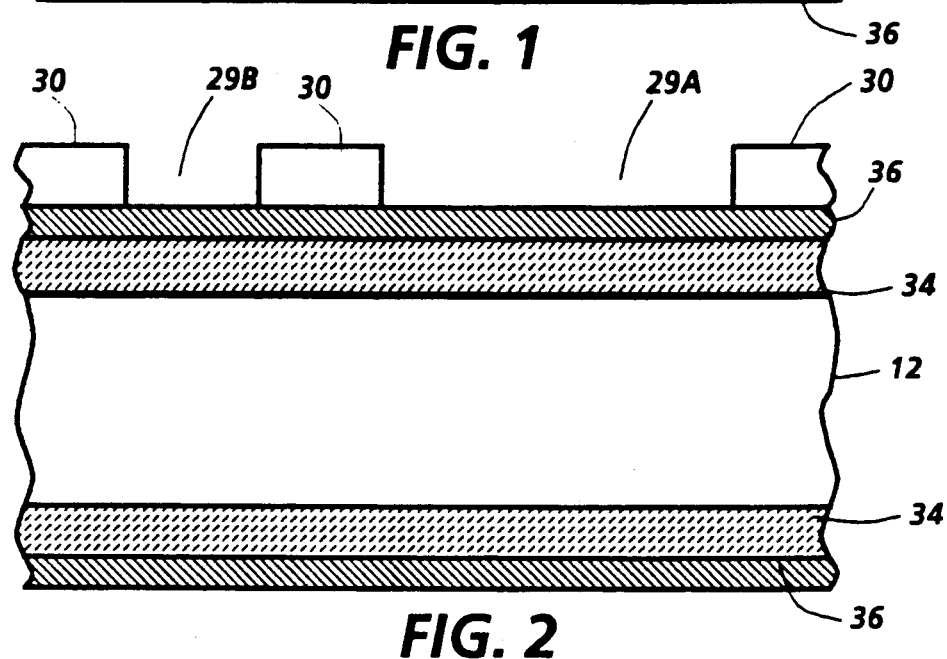
Figure 3:
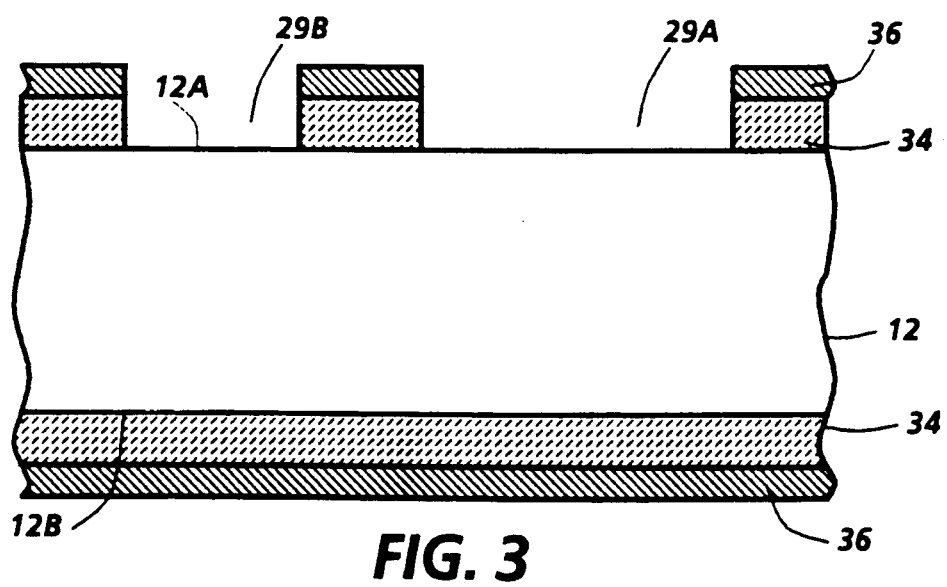

As shown in FIG. 2, the photoresist layer 30 is exposed and developed to form the first and second sets of vias 29A and 29B, respectively, in the photoresist. The first set of vias 29A, represented by a single via, will be used to etch the relatively large through recesses which may be used, for example, as ink reservoirs in the channel plates shown in FIG. 16. Since such large recesses take several hours to etch, and in contrast, the smaller recesses, such as, for example, ink channels, require only 20 to 30 minutes, the dimensional tolerance of the smaller recesses can be much higher, if they are not retained in the etchant for longer periods of time than necessary. Accordingly, the present invention provides an anisotropic etching process which protects the backside for unintentional etching and enables the separate etching of larger, more coarsely toleranced recesses, followed by the etching of the smaller, higher toleranced recesses. This separation of coarse and fine etching is disclosed in U.S. Pat. No. 4,863,560, mentioned above, and is incorporated herein by reference. The second set of vias 29B, also represented by a single via, though actually there are generally many, will be used to etch relatively small recesses requiring high dimensional tolerances and selectively short etching times. In FIG. 3, the first protective layer 36 and first masking layer 34, (i.e. polycrystalline silicon and oxide layers, respectively) are sequentially etched to form first and second sets of vias therein which expose the frontside surface 12A of the wafer or silicon structure 12. Next, the first photoresist layer is removed.

Figure 4:
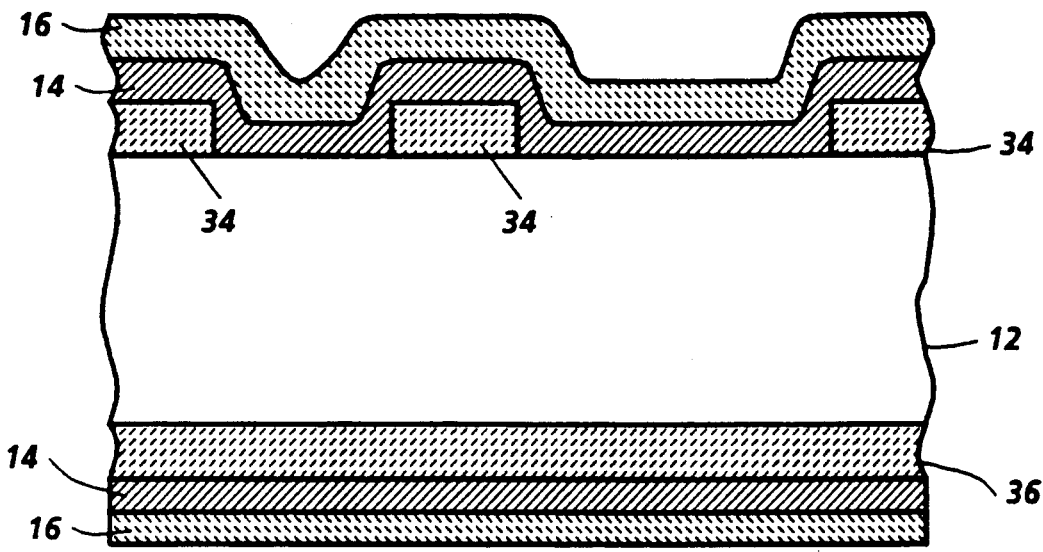
Figure 5:
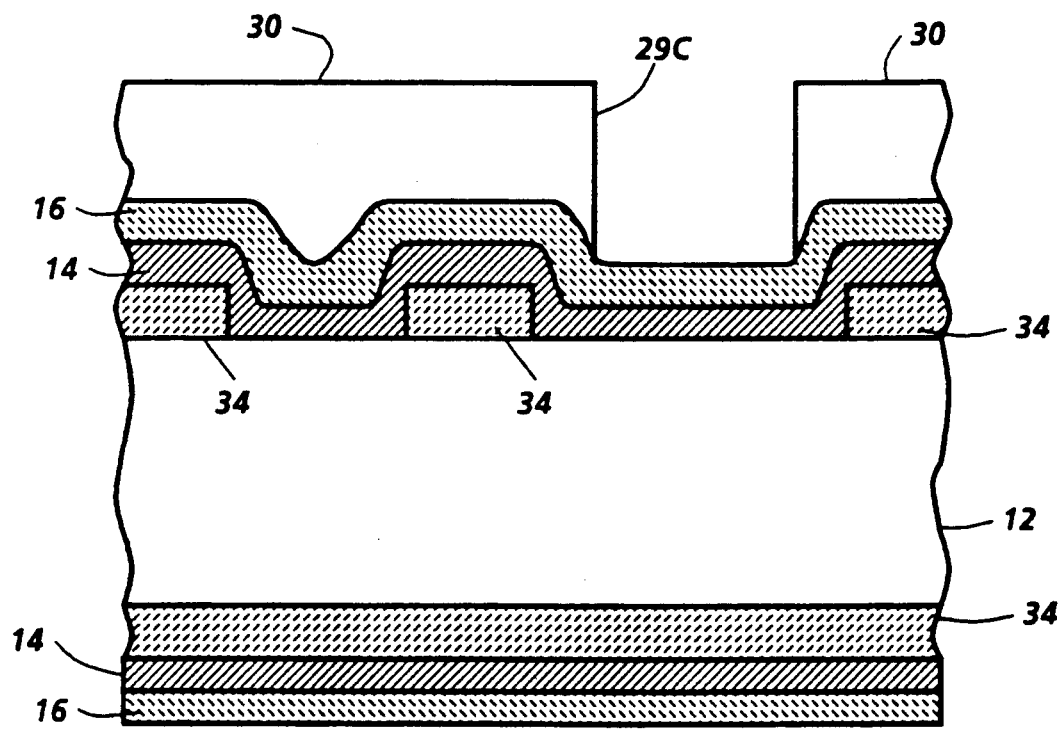

After the first photoresist layer is stripped, the first protective layer is etch removed, leaving only the patterned first masking layer 34. A second etch resistant masking layer 14, one that may be removed without damage to the first masking layer 34, is deposited on the frontside and backside surfaces of the first masking layer and over the first and second sets of vias therein on the frontside of the structure 12. Refer to FIG. 4. A preferred second masking layer is silicon nitride, deposited by chemical vapor deposition (CVD) to a thickness of 0.05 to 0.5 μm. Following the deposition of the second masking layer 14, a second protective layer 16 of preferably polycrystalline silicon is deposited on both sides of the silicon structure 12 over the second masking layer and having a thickness of 0.1 to 1.0 μm. As shown in FIG. 5, a second photoresist layer, similar to the first photoresist layer, is spin coated on the frontside of the structure 12 and over the second protective layer. The second protective layer on the backside of structure 12 prevents crack producing mechanical damage to the first and second masking layers on the backside of the wafer 10 or structure 12 during the deposition and patterning of the second photoresist layer. The second photoresist layer 30 is patterned to form a set of vias 29C therein similar to and aligned with the first set of vias 29A in the first masking layer. This set of vias 29C is slightly smaller than the first set of vias 29A, so that they produce through recesses that are slightly smaller than desired and may be somewhat enlarged during subsequent etching of the smaller recesses, explained later.

Figure 6:
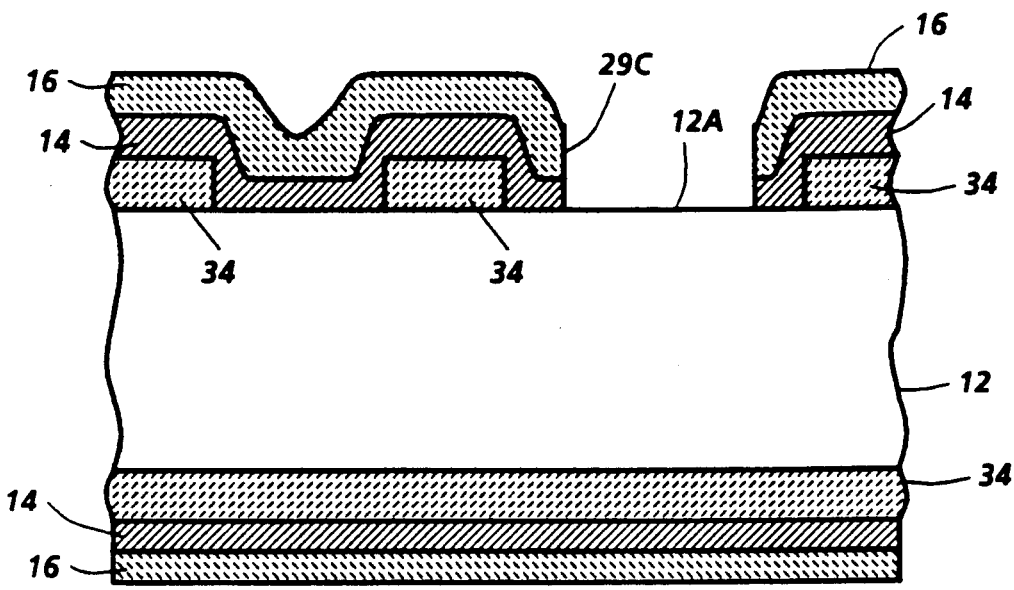
Figure 7:
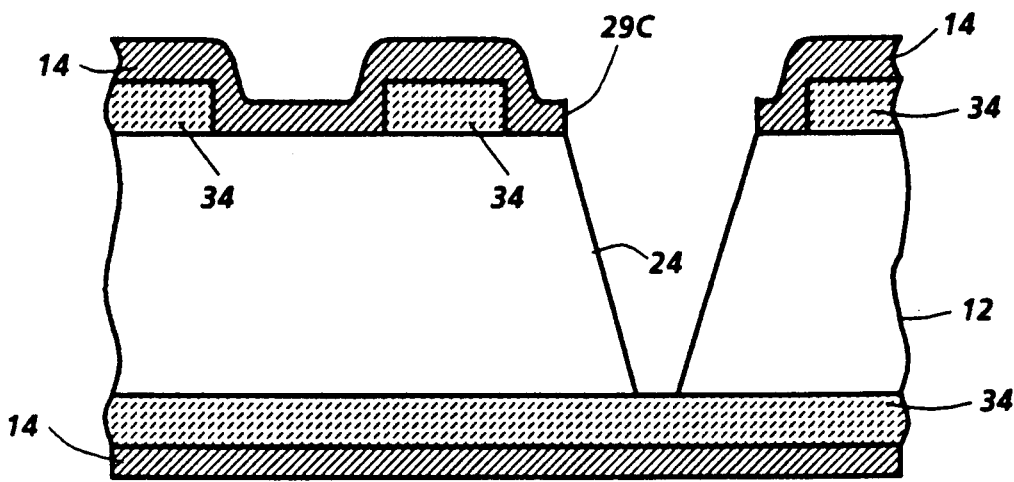

Next, the second protective layer 16 and second masking layer 14 are sequentially plasma etched to provide vias 29C therein, exposing the frontside surfaces 12A of the silicon structure 12, as shown in FIG. 6, and then the second photoresist layer is stripped therefrom. Referring to FIG. 7, the wafer or silicon structure 12 is placed in an etchant bath for anisotropic etching, such as KOH, and after three to four hours through recess 24 is completed having {111} plane walls. When polycrystalline silicon is used as the second protective layer 16, it is concurrently etch removed, leaving a defect-free second masking layer 14 overlying the first masking layer 34.

Figure 8:
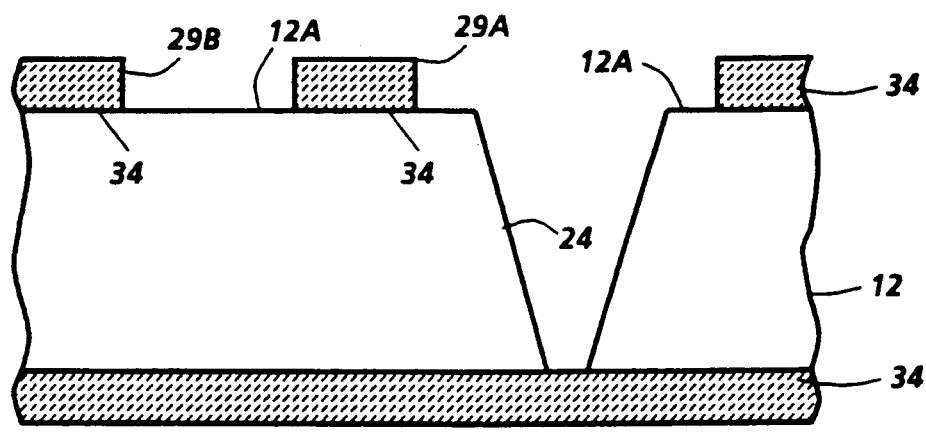
Figure 9:
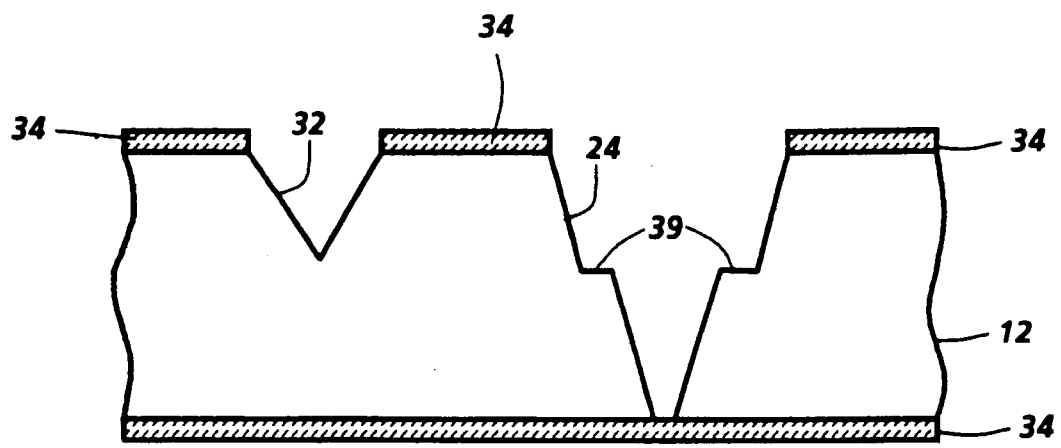
Figure 10:
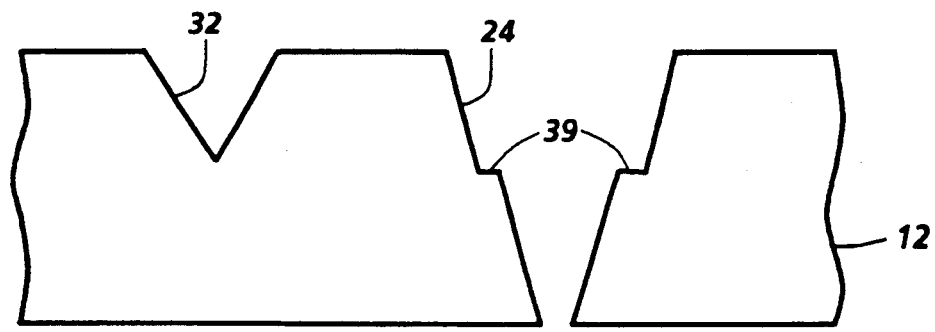

FIG. 8 shows the silicon structure 12 after the second masking layer is removed, exposing the first and second sets of vias 29A and 29B and thus the frontside surface 12A therethrough. As shown in FIG. 9, the wafer or silicon structure is placed in an anisotropic etchant both for the second etching step, such as in KOH for 10 to 30 minutes, and the etching of the three dimensional, silicon device 12 is complete. The smaller recesses 32 etched through the first set of vias are 10 to 75 μm deep and are precisely etched with very close tolerances, while the larger, through recesses have been somewhat concurrently enlarged at the frontside surface 12A of silicon structure 12 to form a relatively narrow ledge or shelf 39. If the structure 12 were permitted to stay in the etchant long enough, the shelf 39 would be etched away leaving only recess walls having {111} planes. Since the large through recesses generally have much lower dimensional requirements, the presence of the narrow shelf 39 is not material and may be ignored. The smaller recesses represent channels 22 in FIG. 16. The final, optional step is the removal of the first masking layer 34 as shown in FIG. 10. Otherwise, only the first masking layer covering the bottom of the recess 24 is removed (see FIG. 16) to enable it to serve as an ink inlet.

The method of fabricating a precision etched, three dimensional silicon device discussed above with reference to FIGS. 1 to 10 requires two masking layers to define two different etch depths in the silicon; for example, a reservoir which is a full through etched defined by the second chemical masking layer, while a set of capillary-filled channels, only 10 to 75 μm deep, are defined by the first chemical masking layer. The primary invention is the protection of the masking layers during the application and patterning of the two photoresist layers which prevent crack-producing damage and thus prevents unintentional etching so that the fabrication yields are greatly improved. Therefore, the two step silicon etching process provides the benefit of greater dimensional control of the channels, since they will be etched for only a short time, the through etched reservoir having been etched earlier. Even though the two step etching requires twice the number of photoresist layers applied and patterned, the silicon wafer is always protected by a protective layer of preferably polycrystalline silicon which readily etches in an anisotropic etchant, simplifying the fabricating process.

In an alternate process, the second etchant may be an isotropic one because the time of exposure of the silicon structure to such etchant is relatively short. In this alternate process, the etched recess walls are generally hemispheric (not shown) as opposed to the ones shown in FIGS. 7–10.

The method of fabricating a precision-etched, three dimensional device from a silicon wafer according to FIGS. 1 to 10 may be simplified, with minimum risk to yield, by deleting the first protective layer 36 which covers and protects the first etch resistant layer 34, during application and patterning of the first masking layer. This is possible because the first etch resistant masking layer is used to mask the wafer during the etching of the relatively shallow, high tolerance recesses which means the exposure of any cracks or scratches in the backside of the first etch resistant mask, preferably silicon dioxide, to the etchant is relatively short. During the longer exposure in an etchant bath for etching of the larger through recesses, the first masking layer is covered by the second masking layer. Therefore, the fabricating process of FIGS. 1–10 remains the same except that in FIGS. 1 to 3, the protective layer 36 is not deposited.

Accordingly, the modified process (not shown) is similar to the process shown in FIGS. 1 to 10. The difference is that the first protective layer is eliminated. The modified process is described as follows. A first etch resistant masking layer 34 of silicon dioxide is deposited on the frontside 12A and backside 12A of a silicon wafer or substrate. The wafer is placed on a vacuum chuck with its backside down in contact with the chuck. A photoimagable or photoresist layer 30 is spin coated on the frontside of the wafer and patterned to produce first and second sets of vias 29A and 29B therein, exposing the first masking layer therethrough. Next, the first masking layer is plasma etched to produce similar first and second sets of vias therein which expose the frontside surface of the wafer, and the photoresist layer is stripped. A second etch resistant masking layer 14 of silicon nitride is deposited on both frontside and backside of the wafer, covering the first etch resistant masking layer including the first and second sets of vias in the frontside layer thereof. A mechanical damage protective layer 16 of polycrystalline silicon is deposited on both sides of the wafer covering the second etch resistant masking layer. The wafer is placed on a vacuum chuck, backside down, and a second photoresist layer is spin coated on the frontside layer of the second masking layer and patterned to produce a set of vias similar to and aligned with the first set of vias in the first masking layer. During this process step, the protective layer on the backside of the wafer prevents cracks and scratches in the second masking layer. The set of vias in the second photoresist layer is slighly smaller than the first set vias in the first making layer to prevent exposure of the edge of the first masking layer to the subsequent etching of the second masking layer. The protective layer and the second masking layer are sequentially plasma etched to produce a set of vias therein which expose the wafer frontside surface. The second photoresist layer is stripped and the wafer placed into an etch bath for anisotropically etching the wafer to produce relatively large, loosely toleranced through recesses therein. If the protective layer is polycrystalline silicon, it is concurrently etch removed while the through recesses are being etched. Otherwise, the protective layer will have to be removed in a separate step. The second masking layer is removed thereby exposing the first masking layer and the first and second sets of vias therein. The wafer is placed in an etch bath for isotropic or anisotropic etching relatively shallow, closely toleranced recesses in the frontside surface of the wafer through the second set of vias, while concurrently completing the etching of the relatively large recesses through the first set of vias. As before, a small shelf or ledge 39 is produced in the large through recesses, if anisotropically etched, because of the relatively short time in the etch bath. As a final step the first masking layer is removed or optionally left on the precision-etched structure. If multiple devices are contained in the etched wafer, separation of the devices are required by a separating process such as dicing.

Figure 17:
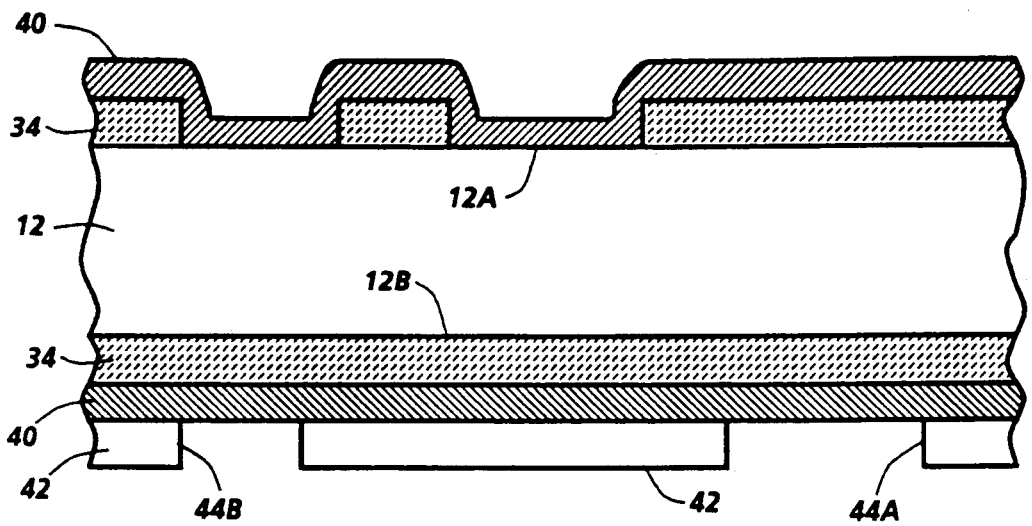
FIGS. 17–21 are cross-sectional views in various steps in fabricating a three dimensional device according to an alternate embodiment of the present invention wherein both frontside and backside surfaces of a silicon wafer are etched.
Figure 18:
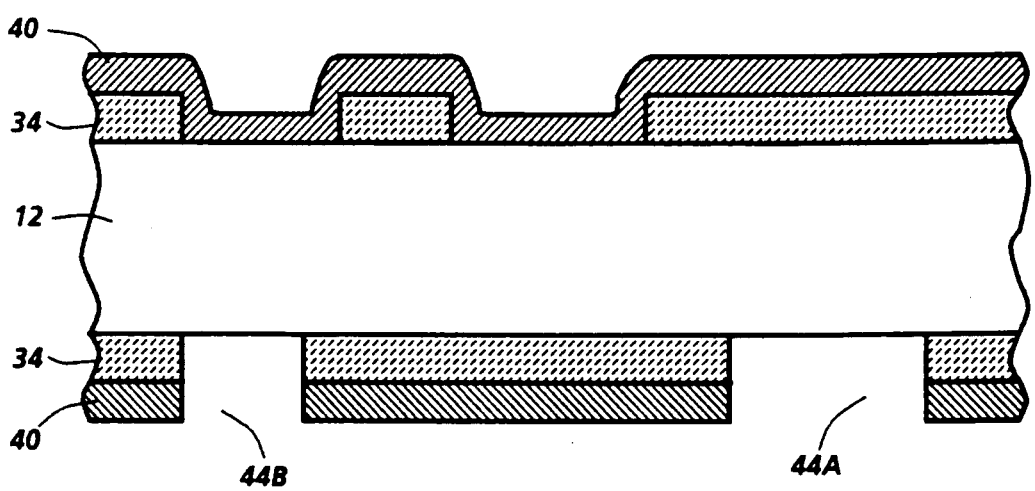

In another embodiment, the three dimensional structure could be etched from both frontside and backside. For this process, wherein etching occurs on both frontside and backside of the wafer, the process begins identically with that disclosed with respect to FIGS. 1 to 3, ending with the removal of the first protective layer 36 and leaving only the first masking layer 34, patterned with first and second sets of vias 29A and 29B, respectively, on the frontside. In order to pattern the first masking layer 34 on the backside of the wafer, the first frontside and backside masking layer on the wafer 12 is covered by chemical vapor deposition of a second protective layer 40, preferably polycrystalline silicon, as shown in FIG. 17. The wafer is placed on a vacuum chuck (not shown) frontside 12A down and in contact with the chuck, and a photoimagable or photoresist layer 42 is spin coated on the backside of the second protective layer 40 and patterned to produce third and fourth sets of vias 44A, 44B, respectively. The second protective layer 40 and first masking layer 34 are sequentially plasma etched and the photoimagable or photoresist layer 42 is stripped therefrom as shown in FIG. 18.

Figure 19:
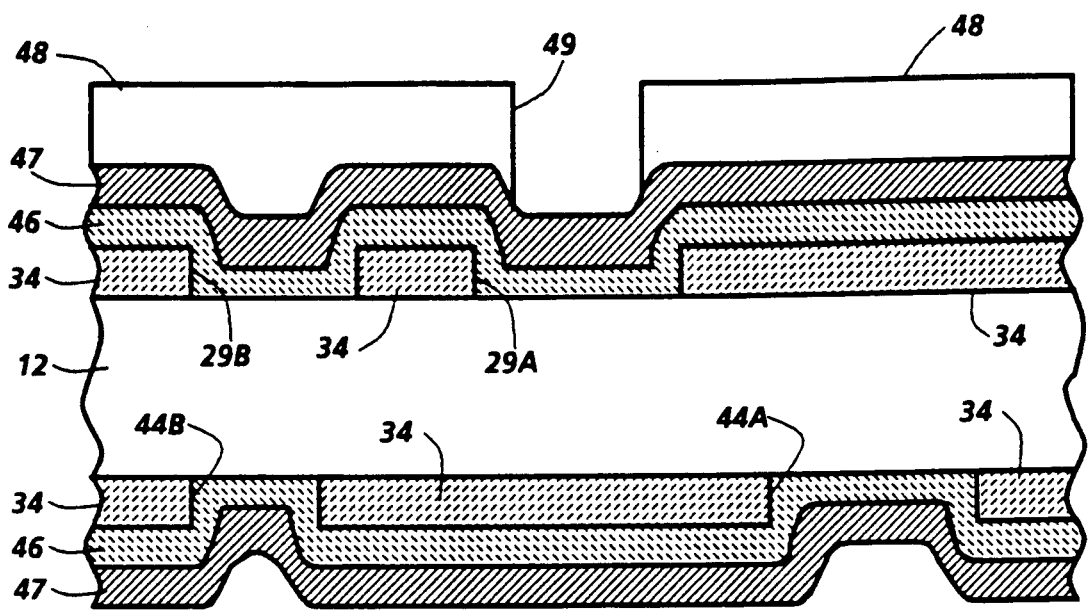

The process proceeds as discussed for FIGS. 4 to 10, only now the backside of the first masking layer 34 is patterned with third and fourth sets of vias 44A and 44B in addition to the first and second sets of vias 29A and 29B in the frontside layer of the first masking layer 34. Referring to FIG. 19, the second protective layer 40 is removed and the second masking layer 46 is deposited followed by the deposition of a third protective layer 47 thereover. These layers are both deposited by, for example, chemical vapor deposition (CVD) sequentially to the frontside and backside surfaces of the first masking layer containing the sets of vias. The second etch resistant masking layer is preferably silicon nitride and the third protective layer is preferably polycrystalline silicon, though other materials could be used so long as they may be deposited and removed sequentially without damage to the other layer. Again, the wafer is placed in a vacuum chuck (not shown), backside down, and a third layer 48 of photoresist or other photoimagable material is spin coated on the frontside over the third protective layer and patterned with a set of vias 49 aligned with and slightly smaller than the first set of vias 29A. During this process step, the third protective layer prevents mechanical damage to the relatively fragile second masking layer, thus preventing cracks or scratches from being developed in the second masking layer. The third protective layer 47 and second masking layer 46 are sequentially plasma etched through the set of vias 49 in the third photoresist layer 48, followed by striping of the third photoresist layer. Alternative to the above, the third protective layer may be removed and a fourth protective layer deposited that is then coated with a photoimagable layer and patterned.

Figure 20:
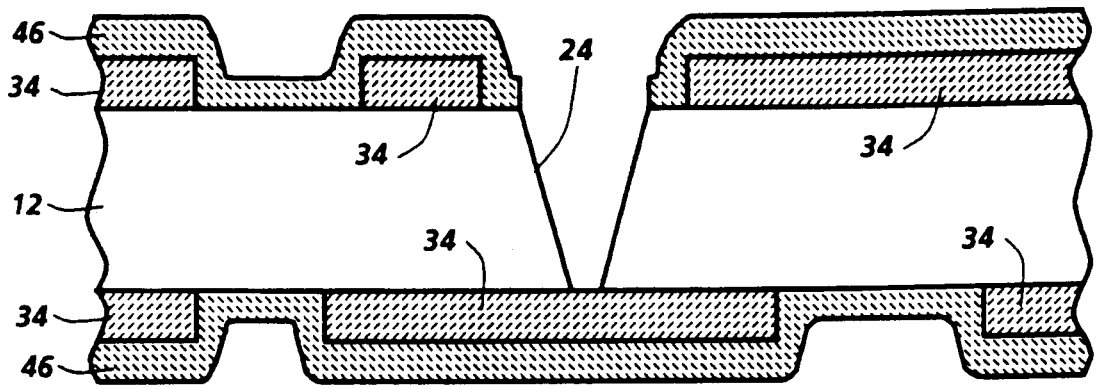
Figure 21:
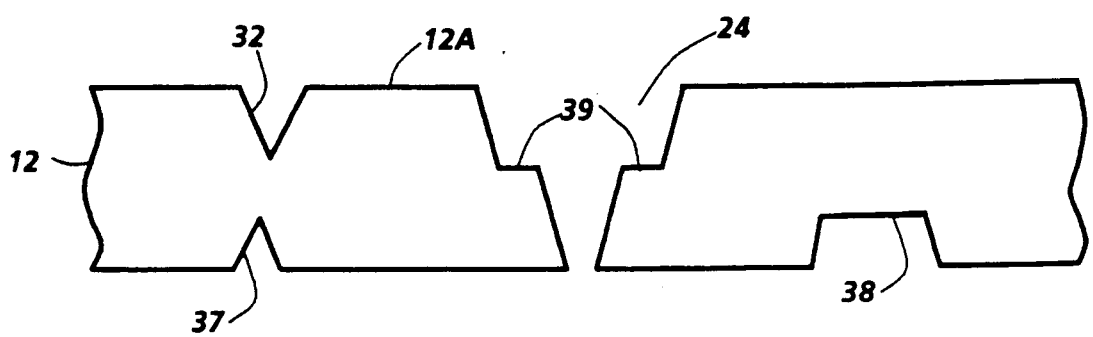

In FIG. 20, the wafer is shown after it is placed in an anisotropic etch bath, such as KOH, for a long enough period of time to provide an etched recess of the appropriate depth, in this case, for three or four hours to achieve through recess 24. If the third protective layer 47 is polycrystalline silicon, it is concurrently etch removed. Otherwise, a separate removal step will be required. Next, the second masking layer 46 is removed, followed by isotropic or anisotropic etching of the wafer having the first masking layer with the first and second sets of vias patterned therein. If an isotropic etch bath is used for a relatively short period of time, the shallow recesses in the frontside and backside surfaces 12A and 12B will have cylindrical or hemispherical, concave recesses (not shown). Preferably, an anisotropic etchant is used which produces shallow recessses 32, 37, 38, each having walls following the {111} planes as shown in FIG. 21. As in FIGS. 9 and 10, shelf or ledge 39 is formed on the walls of recesses 24, generated because of the {100} plane surface surrounding the entrance of the recess 24, when the second masking layer 14 is removed as better shown n FIG. 8.

Figure 22:
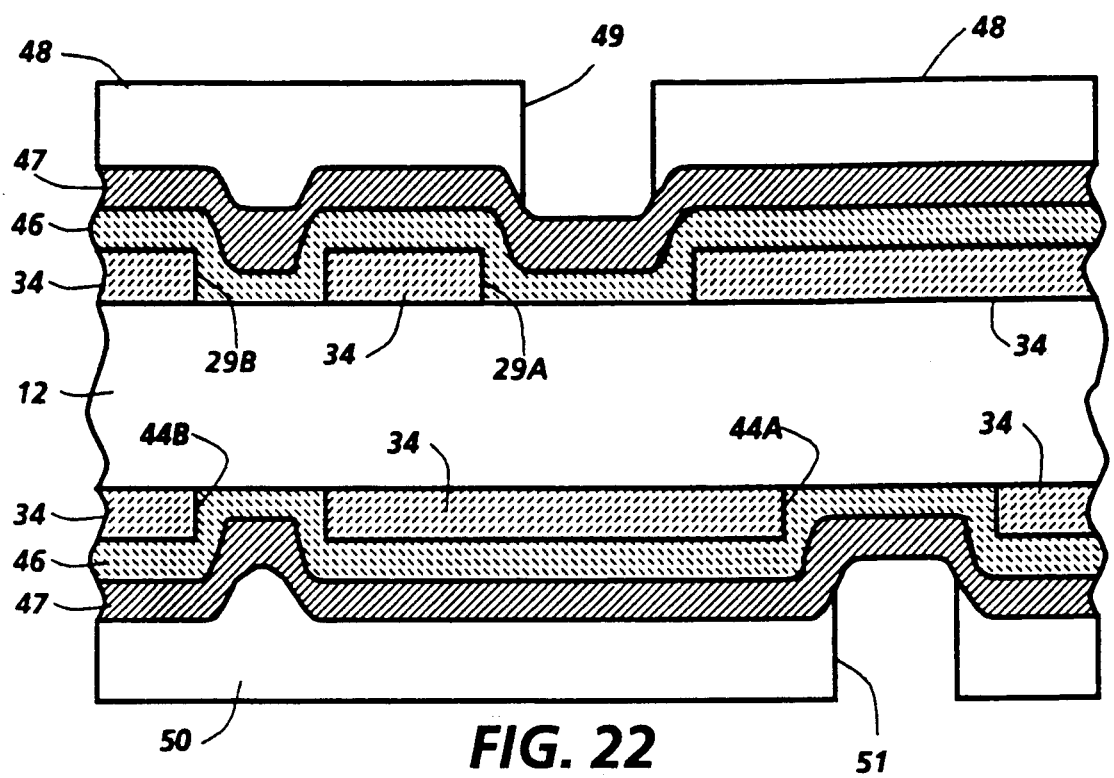
FIGS. 22–24 are cross-sectional views in various steps in fabricating a three dimensional device according to an alternative embodiment of the process shown in FIGS. 17–21.
Figure 23:
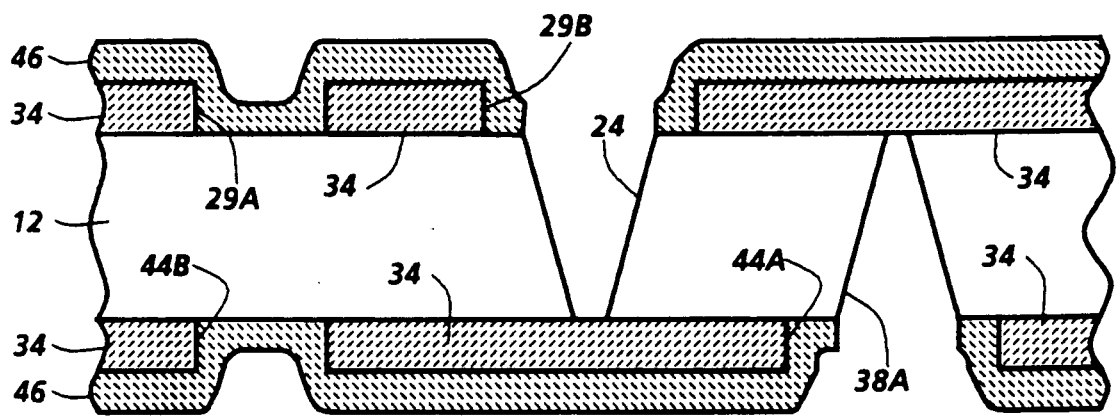

The shallow recess 38 could also be a through recess, if the backside layer of the second masking layer 46 were patterned for concurrent etching with the large, through recess 24. For this to be possible, a fourth photoresist layer 50, shown in FIG. 22, must be spin coated on the backside layer of the third protective layer 47 after the frontside layer of the third protective layer is coated with the third photoresist layer 48. The third and fourth photoresist layers are sequentially patterned to form the sets of vias 49 and a similar set of vias 51 aligned with but slightly smaller than the third set of vias 44A in the backside layer of the first masking layer 34. Thus, after removing the third protective layer 47, concurrently with the anisotropic etching of the large, loosely toleranced through recesses 24 and 38A, if it is polycrystalline silicon, and after removing the second masking layer 46, the wafer is returned to either an isotropic or anisotropic etch bath, preferably an anisotropic etch bath, for etching of the high tolerance shallow recesses 32, 37 in the frontside and backside surfaces 12A and 12B of the wafer 12, respectively.

Figure 24:
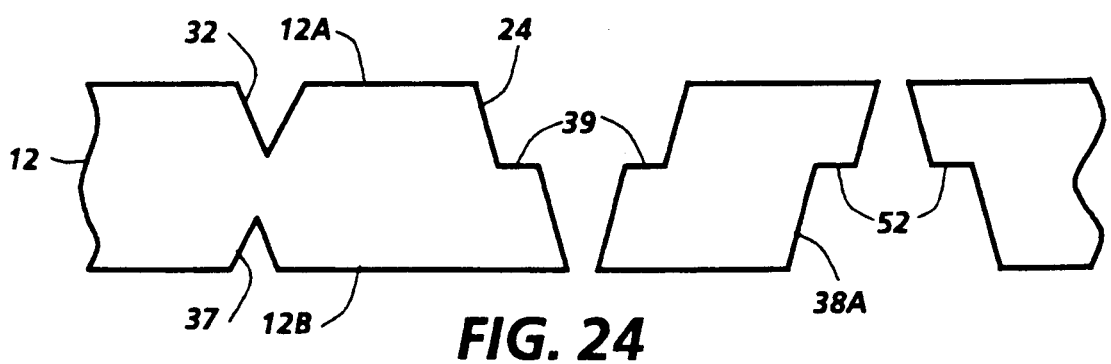

Ledge or shelf 39 in through recess 24 and ledge 52 in through recess 38A are formed during the short anisotropic etching period, as explained before, during the etching of the shallow, high toleranced recesses, as shown in FIG. 24. This cross-sectional view of the wafer 12 is shown after removal of the first masking layer 34. The two-sided etching process may be useful for many reasons, but for a channel plate of a thermal ink jet printhead, it could be used to define buttable ends for assembly of subunits to a pagewidth printhead or even dicing locations as disclosed in, for example, U.S. Pat. No. 4,829,324.

Another method of fabricating a precision etched, three dimensional silicon device by the two step etching process is shown in FIGS. 11 to 14, partial cross-sectional views of a silicon substrate 12 having {100} plane frontside and backside surfaces, such as, for example, a portion of a (100) silicon wafer. These FIGS. 11 to 14 show the additional deposition of a third chemical masking layer over the first masking layer on both frontside and backside surfaces of the substrate 12 in the fabricating process discussed above with respect to FIGS. 1–10, so that the third protective layer is deposited by CVD over the first two masking layers. In this alternate method, the first masking layer 14 is silicon nitride, instead of silicon dioxide used in the process delineated in FIGS. 1 to 10, followed by the disposition of silicon dioxide thereover as the third masking layer 34. Next, the first mechanical damage protective layer 36, preferably polycrystalline silicon, is deposited on the frontside and backside surface of the third masking layer. A first photoresist layer 30 is spin coated by vacuum chuck on the frontside surface of the first protective layer 36, while the backside surface of the first protective layer contacts the vacuum shuck to prevent crack producing mechanical damage to the fragile masking layers.

Figure 11:
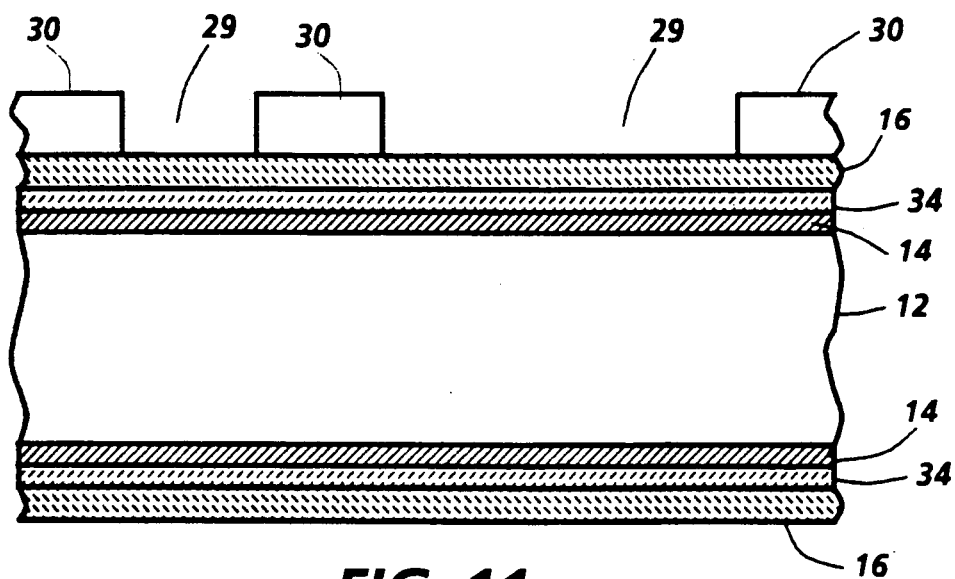
FIGS. 11–14 are cross-sectional views in various steps in fabricating a three dimensional device of an alternative embodiment of the present invention.
Figure 12:
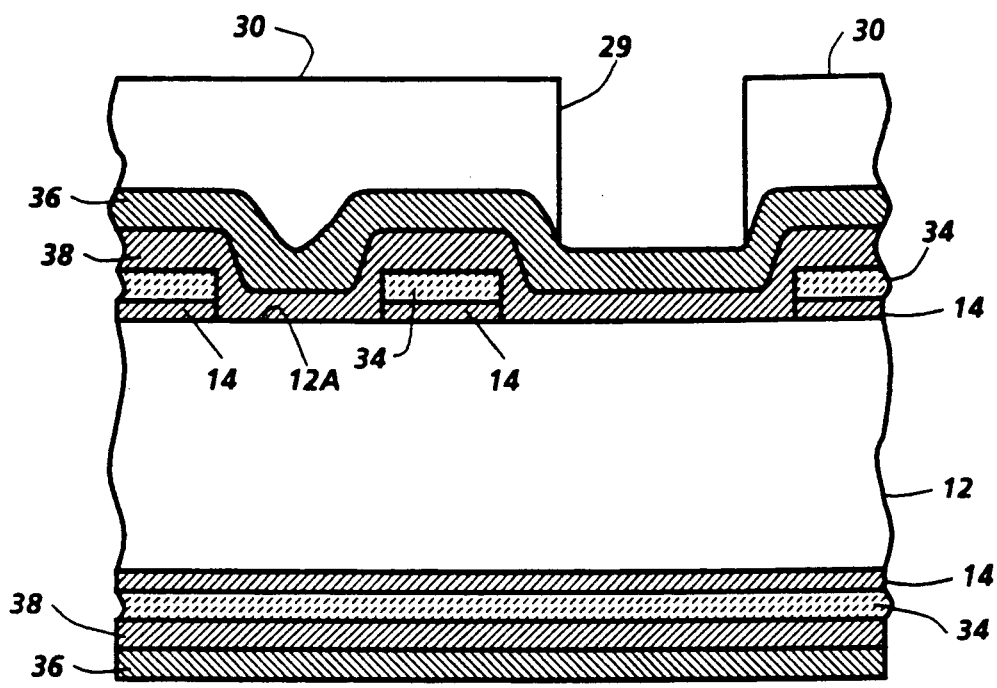

FIG. 11 shows the photoresist layer patterned for first and second sets of vias identical to the sets of vias discussed above with respect to the process shown in FIGS. 1 to 10. The first protective layer, third masking layer, and first masking are sequentially plasma etched to form first and second vias therein, exposing the frontside surface 12A of silicon structure 12, followed by stripping the first photoresist layer and then removing the first protective layer. As shown in FIG. 12, the frontside and backside of the third masking layer, including the first and second sets of vias in the frontside layers, are sequentially covered by the deposition of the second masking layer 38, preferably silicon nitride, and then the second protective layer 36, preferably polycrystalline silicon. As in the first method of fabricating the silicon structure 12, for example, a channel plate 17 (shown in FIG. 16), a second photoresist layer 30 is spin coated on the frontside surface of the second protective layer and patterned for vias aligned with but slightly smaller than the first set of vias in the first and third masking layers, while concurrently the structure backside masking layers are protected from damage by the protective layer 36 covering the backside layers of the first, second, and third masking layers.

Figure 13:
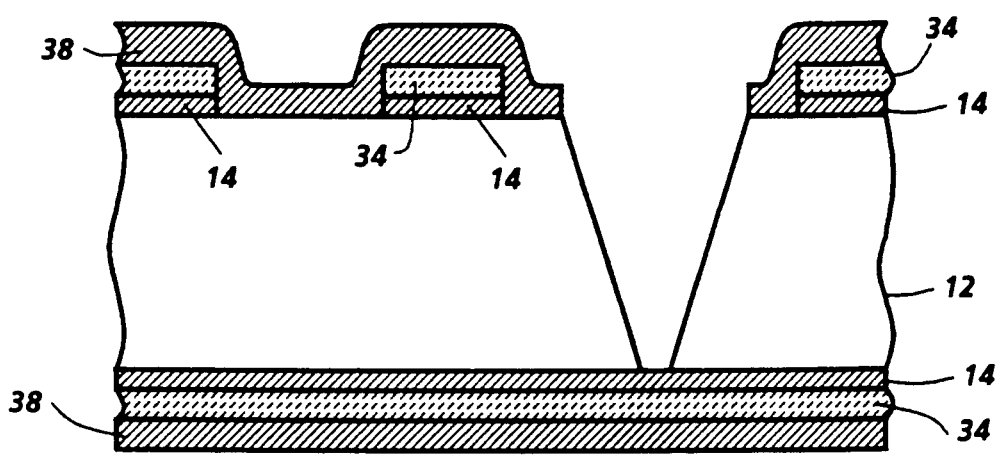
Figure 14:
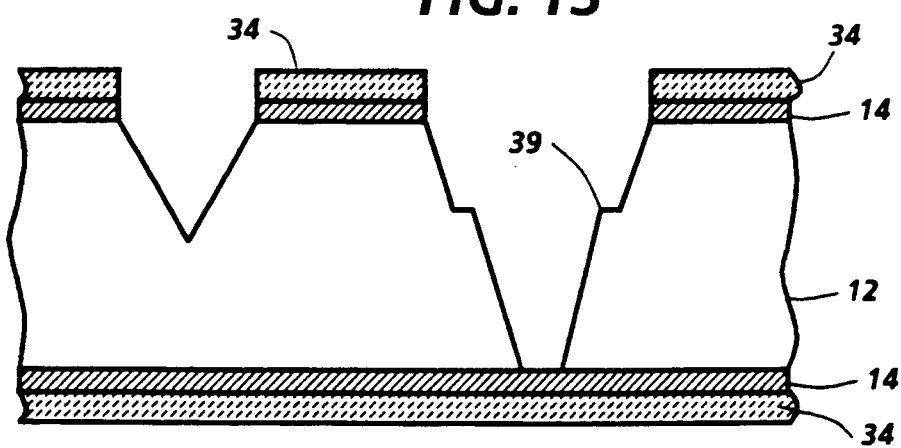

FIG. 13 shows that the second protective layer and second masking layer have been sequentially plasma etched to form a set of vias therein for subsequent use for etching the large recesses produced by etching through the wafer or structure 12. For a typical wafer, the thickness is about 20 mils. Next, the photoresist layer 30 is stripped from the silicon structure 12 and then it is placed in an anisotropic etchant bath for about three to four hours, depending on bath composition, temperature, bath concentration and wafer thickness, for etching the deep recess. The second protective layer 36, if it is polycrystalline silicon, is concurrently etch-removed by the etchant bath of, for example, KOH. Referring to FIG. 14, the second masking layer 38 is removed and the silicon structure 12 is returned to another anisotropic etchant bath for 20 to 30 minutes for the selectively small, shallow recesses enabled by the second set of vias in the first and third masking layers. Further, minor etching is also accomplished in the large through recess which is, of course, also exposed to the etchant, and shallow ledges or shelves 39 are formed therein. The removal of the first and third masking layers after the fine and coarse etching of the recesses representing, for example, channels and reservoir in a channel plate 17 of a printhead, produces a precision etched, three dimensional silicon structure or device as shown in FIGS. 10 and 16, discussed above.

In summary, this invention discloses the use of a mechanically protective layer over the delicate, mechanical damage prone chemical masking layers deposited on silicon wafers to protect the masking layers during normal handling required for processing, such as, for example, their placement on a vacuum chuck for spin coating with a photoresist. While silicon nitride and silicon dioxide have excellent etch resistance to a wide variety of useful chemical etches and are, therefore, the preferred masking layers, their tensile stress makes them tend to readily crack open, since a spreading crack relieves the internal stress. In the preferred embodiment, a deposition of polycrystalline silicon, the preferred protective layer, on top of two masking layers, sequentially patterned to define two different etch depths, are used, so that the same chemistry for pattern etching the silicon nitride on the frontside can also be used to pattern the protective layer. Each pattern of vias in each masking layer on the frontside of the wafer requires a separate protective layer to protect its backside layer from crack generating damage that would cause unintentional etching of the wafer backside surface, thus reducing yield and increasing fabrication costs.

With additional process steps, etching on both sides of the wafer may be accomplished while a protective layer always protects the wafer masking layer in contact with, for example, device equipment used to apply and pattern the photoresist layer.

Many modifications and variations are apparent from the foregoing description of the invention, and all such modifications and variations are intended to be within the scope of the present invention.

We claim:

1. A method of fabricating a precision-etched, three dimensional device from a silicon wafer having a frontside and a backside surface, the device being produced by etching only the wafer frontside surface, comprising the steps of:

(a) depositing a first etch resistant masking layer on both frontside and backside surfaces of a clean wafer;

(b) depositing a first mechanical damage protective layer over the first masking layer on both the frontside and backside surfaces of the wafer;

(c) applying and patterning a first photoimagable layer on the first protective layer on the wafer frontside surface to produce first and second sets of vias in the first photoresist layer exposing the first protective layer through said sets of vias, the first masking layer on the wafer backside surface being concurrently protected from damage by the first protective layer thereover;

(d) etching the exposed first protective layer and underlying first masking layer on the wafer frontside surface through the first and second sets of vias in the first photoresist layer to form sets of vias therein which expose the wafer frontside surface;

(e) stripping the patterned first photoimagable layer from the frontside surface of the wafer;

(f) removing the first protective layer from the frontside and backside surfaces of the wafer;

(g) depositing a second etch resistant masking layer over the first etch resistant masking layer on both frontside and backside surfaces of the wafer, so that the vias in the first masking layer exposing the wafer frontside surface are covered by said second masking layer;

(h) depositing a second mechanical damage protective layer over the second masking layer on both frontside and backside surfaces of the wafer;

(i) applying and patterning a second photoimagable layer on the second protective layer on the wafer frontside surface to produce a set of vias similar to and aligned with the first set of vias in said first masking layer, the set of vias in the second photoresist layer being slightly smaller than the first set of vias in said first masking layer, the second masking layer on the wafer backside surface being concurrently protected from damage by the second protective layer thereover;

(j) etching the exposed second protective layer and underlying second masking layer through the set of vias in the second photoimagable layer to form a set of vias therein which expose the wafer frontside surface;

(k) stripping the patterned second photoresist layer from the frontside surface of the wafer;

(l) anisotropically etching the wafer in an etch bath, so that the frontside surface of the wafer exposed through the set of vias in the second protective layer and the second masking layer produce relatively large, loosely toleranced recesses therein;

(m) removing the second protective layer and then the second masking layer exposed by the removal of the second protective layer, thereby leaving a defect-free first masking layer on the wafer with the large, loosely toleranced recesses substantially completed; and (n) anisotropically etching the wafer in an etch bath, so that the frontside surface of the wafer exposed through the first and second sets of vias in the first masking layer produce relatively small, closely toleranced recesses in the frontside wafer surface through second set of vias, while concurrently completing the etching of the relatively large recesses in the frontside wafer surface through the first set of vias.

2. The method of claim 1, wherein the etching of the wafer during step (1) further comprises concurrently etch-removing the second protective layer on both sides of the wafer, thereby leaving a defect-free second masking layer covering the first masking layer, so that step (m) involves only removing of the second masking layer; and after step (n), removing the first masking layer.

3. The method of claim 2, wherein the first etch resistant masking layer is silicon dioxide and the second etch resistant masking layer is silicon nitride; and wherein the first and second mechanical damage protective layer are both polycrystalline silicon.

4. The method of claim 3, wherein the first set of vias etched are for etching relatively large, low toleranced recesses, and the second set of vias etched are for etching relatively small, high toleranced recesses.

5. The method of claim 4, wherein the first and second sets of vias are for etching a channel plate for use in a thermal ink jet printhead, the first set of vias being for etching at least one through recess for serving as an ink reservoir, the open bottom being the ink inlet thereto, and the second set of vias are for etching the ink channels which interconnect the reservoir with an array of nozzles.

6. The method of claim 1, wherein the method further comprises the steps of:
(o) depositing between steps (a) and (b) a third etch resistant masking layer over the first masking layer on both frontside and backside surfaces of the wafer, so that the first protective layer deposited during step (b) is over the third masking layer;
(p) said etching during step (d) concurrently forming said first and second sets of vias sequentially in the first protective layer, the third masking layer, and the first masking layer, respectively, to expose the frontside wafer surface therethrough;
(q) said depositing of the second masking layer during step (g) being over the third masking layer, as well as over the vias therein and the underlying first masking layer;
(r) said set of vias patterned during step (i) being similar to and aligned with the first set of vias in the third masking layer and underlying first masking layer; and
(s) said removal of the second protective layer and the second masking layer leaving a defect-free third masking layer and underlying first masking layer on the wafer with the large, loosely toleranced recesses substantially completed.

7. The method of claim 6, wherein the first and second etch resistant masking layers are silicon nitride and the intermediate third etch resistant masking layer is silicon dioxide; and wherein the first and second mechanical damage protective layers are both polycrystalline silicon, so that the etching during step (1) concurrently etch-removes the second protective layer on both sides of the wafer.

8. The method of claim 7, wherein the first set of vias are for etching relatively large, low toleranced recesses and the second set of vias are for etching the relatively small, high toleranced recesses.

9. A method of fabricating a precision-etched, three dimensional device from a silicon wafer having a frontside and a backside surface, comprising the steps of:

(a) depositing a first etch resistant masking layer on both frontside and backside surfaces of a clean wafer;
(b) applying and patterning a first photoimagable layer on the first masking layer on the wafer frontside surface to produce first and second sets of vias in the first photoimagable layer exposing the first masking layer through said sets of vias;
(c) etching the first masking layer on the wafer frontside surface through the first and second sets of vias in the first photoimagable layer to form sets of vias therein which expose the wafer frontside surface;
(d) stripping the patterned first photoimagable layer from the frontside surface of the wafer;
(e) depositing a second etch resistant masking layer over the first etch resistant masking layer on both frontside and backside surfaces of the wafer, so that the vias in the first masking layer exposing the wafer frontside surface are covered by said second masking layer;
(f) depositing a mechanical damage protective layer over the second masking layer on both frontside and backside surfaces of the wafer;
(g) applying and patterning a second photoimagable layer on the protective layer on the wafer frontside surface to produce a set of vias similar to and aligned with the first set of vias in said first masking layer, the set of vias in the second photoresist layer being slightly smaller than the first set of vias in said first masking layer, the second masking layer on the wafer backside surface being concurrently protected from damage by the protective layer thereover;
(h) etching the exposed protective layer and underlying second masking layer through the set of vias in the second photoimagable layer to form a set of vias therein which expose the wafer frontside surface;
(i) stripping the patterned second photoimagable layer from the frontside surface of the wafer;
(j) anisotropically etching the wafer in an etch bath, so that the frontside surface of the wafer exposed through the set of vias in the protective layer and the second masking layer produce relatively large, loosely toleranced recesses therein;
(k) removing the protective layer and then the second masking layer exposed by the removal of the second protective layer, thereby leaving a defect-free first masking layer on the wafer with the large, loosely toleranced recesses substantially completed; and
(l) etching the wafer in an etch bath, so that the frontside surface of the wafer exposed through the first and second sets of vias in the first masking layer produce relatively small, closely toleranced recesses in the frontside wafer surface through second set of vias, while concurrently completing the etching of the relatively large recesses in the frontside wafer surface through the first set of vias.

10. The method of claim 9, wherein the first etch resistant masking layer is silicon dioxide; wherein the second etch resistant masking layer is silicon nitride; and wherein the mechanical damage protective layer is polycrystalline silicon.

11. The method of claim 10, wherein the etching in step (1) is accomplished with an isotropic etch bath.

12. The method of claim 10, wherein the etching in step (l) is accomplished with an anisotropic etch bath.

13. The method of claim 12, wherein the method further comprises:

(m) after step (a), depositing a first mechanical damage protective layer over the first masking layer on both frontside and backside of the wafer, so that the first photoimagable layer applied and patterned in step (b) is over said first protective layer, the first masking layer on the wafer backside therefore being concurrently protected from damage by the first protective layer during said applying and patterning of the photoimagable layer on the wafer frontside;

(n) during the etching in step (c), the first protective layer being etched first, followed by sequential etching of the underlying first masking layer;

(o) after step (d), removing the first protective layer from the frontside and backside surfaces of the wafer; and (p) wherein the mechanical damage protective layer deposited in step (f) becomes the second protective layer.

14. The method of claim 13, wherein the method further comprising the steps of:

(q) depositing a third mechanical damage protective layer after step (o);

(r) applying and patterning a third photoimagable layer on the backside of the wafer and over the third protective layer to produce at least one set of vias therein to expose said third protective layer on said wafer backside, while the masking layers on the wafer frontside are being concurrently protected;

(s) sequentially etching vias through said third protective layer and underlying first masking layer to expose the wafer backside surface;

(t) stripping the photoimagable layer from the wafer backside surface;

(u) removing the third protective layer from the frontside and backside of the wafer, leaving the first masking layer on both frontside and backside of the wafer with vias therein for subsequent etching;

(v) wherein at step (e), the second masking layer covers vias in the first masking layer on both frontside and backside of the wafer; and (w) wherein the etching during step (l) concurrently etches the first and second sets of vias in the first masking layer on the frontside of the wafer and the vias in the first masking layer on the backside of the wafer, so that precision-etching of the wafer is accomplished on both frontside and backside thereof.

* * * * *